(12) United States Patent
Curatola et al.

(10) Patent No.: US 7,839,209 B2
(45) Date of Patent: Nov. 23, 2010

(54) TUNNEL FIELD EFFECT TRANSISTOR

(75) Inventors: Gilberto Curatola, Korbek-Lo (BE); Prabhat Agarwal, Brussels (BE); Jan W. Slotboom, Eersel (NL); Godefridus A. M. Hurkx, Best (NL); Radu Surdeanu, Roosbeek (BE); Gerben Doornbos, Heverlee (BE)

(73) Assignee: NXP B.V., Eindhoven (NL)

( * ) Notice: Subject to any disclaimer, the term of this patent is extended or adjusted under 35 U.S.C. 154(b) by 69 days.

(21) Appl. No.: 12/444,140

(22) PCT Filed: Oct. 3, 2007

(86) PCT No.: PCT/IB2007/054020

§ 371 (c)(1),
(2), (4) Date: Apr. 2, 2009

(87) PCT Pub. No.: WO2008/041188

PCT Pub. Date: Apr. 10, 2008

(65) Prior Publication Data

US 2010/0097135 A1    Apr. 22, 2010

(30) Foreign Application Priority Data

Oct. 5, 2006   (EP)   .................. 06121784

(51) Int. Cl.
*H01L 25/00* (2006.01)
(52) U.S. Cl. .................................. 327/566
(58) Field of Classification Search ................. 327/564, 327/565, 566, 574, 581
See application file for complete search history.

(56) References Cited

U.S. PATENT DOCUMENTS

| 4,835,581 | A  |   | 5/1989  | Kuroda et al. |
| 5,105,241 | A  | * | 4/1992  | Ando ..................... 257/194 |
| 5,840,596 | A  |   | 11/1998 | Kovacic |
| 2002/0017644 | A1 |   | 2/2002  | Fitzgerald |
| 2004/0206950 | A1 |   | 10/2004 | Suvkhanov et al. |

FOREIGN PATENT DOCUMENTS

| EP | 0256360 A | 2/1988 |
| EP | 1253648 A | 10/2002 |
| WO | 2006030505 A1 | 3/2006 |

OTHER PUBLICATIONS

"Silicon Surface Tunnel Transistor"; Applied Physics Letters, AIP, American Institute of Physics, Melville, NY, US; vol. 67, No. 4; Jul. 24, 1995; pp. 494-496; XP012014432; ISSN: 0003-6951.

Leburton, J.P., et al; "Bipolar Tunneling Field-Effect Transistor: A Three-Terminal Negative Differential Resistance Device for High-Speed Applications"; Applied Physics Letters; AIP; American Institute of Physics, Melville, NY, US; vol. 52, No. 19; May 9, 1988; pp. 1608-1610; XP000035703; ISSN: 0003-6951.

* cited by examiner

*Primary Examiner*—Jeffrey S Zweizig

(57) ABSTRACT

A tunnel transistor includes source diffusion (4) of opposite conductivity type to a drain diffusion (6) so that a depletion layer is formed between source and drain diffusions in a lower doped region (8). An insulated gate (16) controls the position and thickness of the depletion layer. The device includes a quantum well formed in accumulation layer (20) which is made of a different material to the lower layer (2) and cap layer (22).

10 Claims, 4 Drawing Sheets

TUNNEL FIELD EFFECT TRANSISTOR

The invention relates to a tunnel field effect transistor and a method of making it.

Conventional bulk field effect transistors of the type which do not use tunneling effects are very well known. Typically, such transistors may have diffused source and drain diffusions of one conductivity type (both highly doped n-type or both highly doped p-type) laterally separated by a body region. An insulated gate electrode on the body region controls conduction in a channel immediately under the gate between source and drain.

There is a continuing desire to decrease the size of such conventional transistors. However, in spite of the great success in reducing transistor dimensions in recent decades, there are a number of problems associated with further reductions of transistor scale. In particular, short channel effects become increasingly important. The source and drain depletion regions protrude into the channel and reduce the control exerted by the gate over the channel. This results in a large degradation of the subthreshold slope when operating with high voltages between source and drain, that is to say when operating in the high longitudinal field region. This increases the off-state current.

This increased off state current has two disadvantages—it lowers the maximum switching speed and increases the leakage current which in turn increases static power consumption.

The off-state current is represented by a thermal diffusion current over a potential barrier. The Fermi-Dirac distribution of carriers limits the sub-threshold slope to an intrinsic limit of 60 mV/decade. Thus, even if the short channel effects could be completely controlled and optimised, this physical 60 mV/decade limit would limit the maximum switching speed.

For this reason, there is intense interest in alternative transistor types based on different transport mechanisms not subject to this limit. There is a particular desire for transistor types that can be made with conventional fabrication techniques used in a standard CMOS process.

One such transistor type is a tunnel transistor, as discussed by Reddick and Amaratunga, "Silicon Surface Tunnel Transistor", Appl. Phys. Lett., volume 67, pages 494 to 496 (1995).

A tunnel transistor according to related art is illustrated schematically in FIG. 1.

A source region 4, drain region 6 and low-doped region 8 are all provided on substrate 2. The source region is heavily doped p+ and the drain region n+. A source contact 10 and a drain contact 12 are provided on the source 4 and drain 6 regions respectively. A conductive gate 14 is provided over the low doped region, insulated from the low doped region 8 by a thin gate insulator 16.

When a negative voltage is applied to the gate 14, an accumulation layer is formed extending from the p+ source region 4 towards the drain region 6 through most of the low doped region 8, leaving a thin depletion layer between source and drain regions. The exact width of the thin depletion layer is modulated by the gate voltage as well as the voltage applied to the drain region 6. Tunneling takes place laterally through this thin depletion layer.

The current between source and drain is controlled in this way. The device does not suffer from the intrinsic limit of conventional devices.

According to the invention there is provided a tunnel field effect transistor according to claim 1.

It should be noted that the device operates as a tunneling device, that is to say the device does not operate by changing the carrier concentration in a channel, but instead operates by changing the depletion region thickness between the n-type and p-type regions at the source and drain electrodes (or vice versa). This in turn changes the tunneling current.

A buried layer is used as a quantum well to confine carriers, which in turn increases the tunnel probability. The higher longitudinal electric field results in a thinner tunneling barrier and consequently an enhanced tunneling current.

The increased longitudinal electric field also allows the device to operate with much lower voltages between source and drain than conventional tunneling devices.

The device has the advantage that it can be manufactured by conventional CMOS processes.

By confining electrons or holes in the accumulation layer the electrons or holes are spaced from the interface between the gate insulator and the semiconductor. This supresses the effect of surface roughness at the interface between the gate insulator and the semiconductor layer. This can increase the mobility in the device.

In a preferred embodiment, the cap layer and lower layer are of silicon and the accumulation layer of silicon germanium.

Calculations by the inventors have revealed an additional problem that can arise. There may be two peaks of concentration of carriers in the accumulation layer, one at the interface between the cap layer and the accumulation layer and one at the interface between the accumulation layer and the lower layer. Depending on device parameters such as thickness and doping, the gate may have a less substantial effect on the lower of these layers which can result in poor device properties. Thus, this second lower peak of concentration may act as a parasitic channel.

In one approach to dealing with this problem, the drain diffusion extends from the first major surface as far as the interface between the cap layer and the accumulation layer but is spaced from the interface between the accumulation layer and the lower layer. In this way, the p-n junction between source and drain is spaced from the interface between the accumulation layer and the lower layer. This means that only the upper concentration of carriers is adjacent to the source drain and even if a parasitic channel is present it is disconnected from source and drain and does not contribute.

Alternatively or additionally, a graded accumulation layer in which the material properties change with depth can be used.

In embodiments, the silicon germanium layer is graded having a formula $Si_{1-x}Ge_x$ with the value x varying with depth below the first major surface.

The value of x may vary from 0 at the interface between the accumulation layer and the lower layer to a maximum value at the interface between the accumulation layer and the cap layer.

The maximum value of x may be in the range 0.2 to 0.5, preferably 0.35 to 0.45.

The thickness of the accumulation layer may be in the range 5 nm to 20 nm. This is suitable, in embodiments, for avoiding excessive stress in the device caused by lattice mismatch between the first and second materials. Those skilled in the art will be able to select suitable accumulation layer thicknesses which will of course depend on the material choices used.

As well as the main channel and parasitic channel, calculations by the inventors reveal that there can also be a third channel right at the oxide/channel interface. It also acts as a parasitic channel and screens the accumulation layer from the voltage applied to the gate electrode. The possibility of modulating the accumulation layer via the gate voltage is, therefore, reduced.

In order to minimize this effect, the thickness of the cap layer should be properly chosen. Accordingly, in embodiments, the thickness of the cap layer may be in the range 3 nm to 15 nm, preferably 5 nm to 12 nm. Again, those skilled in the art will be able to select suitable values for given materials and device parameters.

In a preferred embodiment, the first conductivity type is n type and the second conductivity type is p type.

The invention also relates to the use of a transistor as discussed above, the use including applying a voltage between source and drain; and applying a voltage to the gate electrode to modulate the width of the depletion region between the source and drain and hence vary the current between source and drain.

For a better understanding of the invention embodiments will now be described, purely by way of example, with reference to the accompanying drawings, in which.

Figure 1:
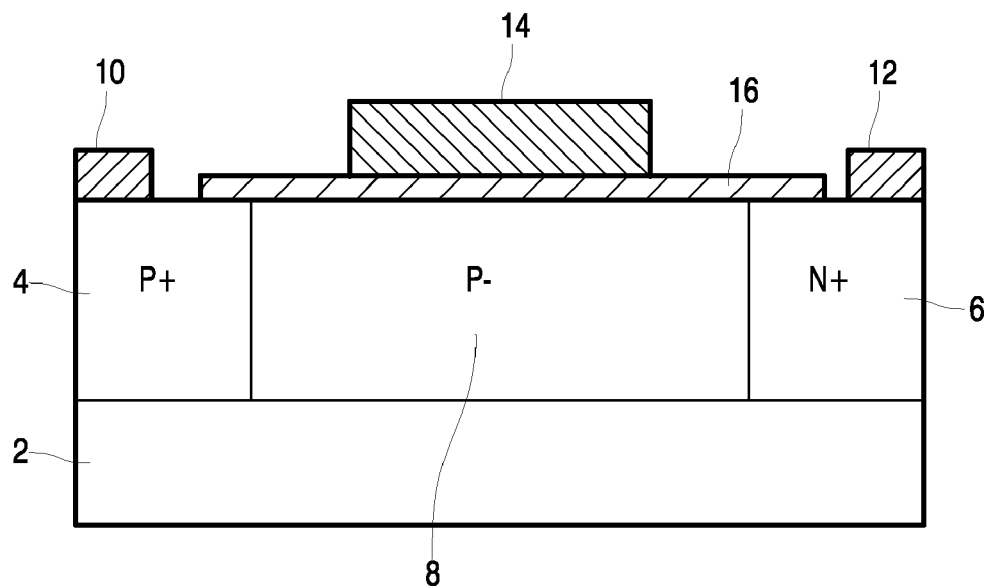
FIG. 1 shows a tunnel transistor according to related art.
Figure 2:
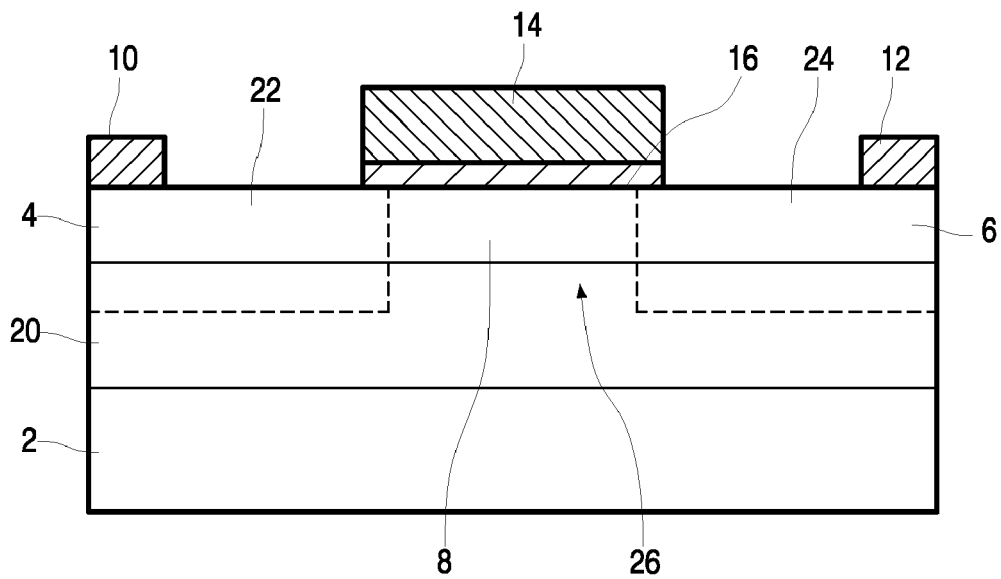
FIG. 2 shows a tunnel transistor according to an embodiment of the invention.

Referring to FIG. 2, the structure is formed on a low doped or undoped silicon substrate, acting as a lower layer 2. Alternatively, an epilayer on a substrate (not shown) may be used if required as the lower layer 2.

Above the lower layer is formed a SiGe accumulation layer 20. In the embodiment described, this is 10 nm thick.

Above the accumulation layer 20 a cap layer 22 of silicon is formed, the top of the cap layer being a first major surface 24. In the embodiment, this cap layer is 10 nm thick.

Source and drain diffusions 4, 6 are provided. Both of these diffusions are highly doped to provide a good contact. The source and drain diffusions extend through the cap layer 22 to the accumulation layer, but not as far as the lower layer 2. In the embodiment, the diffusion is to a depth of 15 nm for reasons that will be discussed below.

The source diffusion is p+ and the drain diffusion n+. The doping density may be, for example $10^{21}$ cm$^{-3}$ in both cases.

The lower doped region 8 between the source and drain diffusions may conveniently be p− with a doping density of less than $10^{16}$ cm$^{-3}$, or slightly higher. Alternatively, the lower doped layer 8 may be undoped. Note that this is preferably the doping density in the accumulation layer 20 where the source and drain diffusions are absent. The doping in the cap layer is less critical, though it should be low, and this layer may conveniently be undoped.

The skilled person will realise that the doping levels may be adjusted as required.

The inventors have carried out calculations to the properties of the device described.

Figure 3:
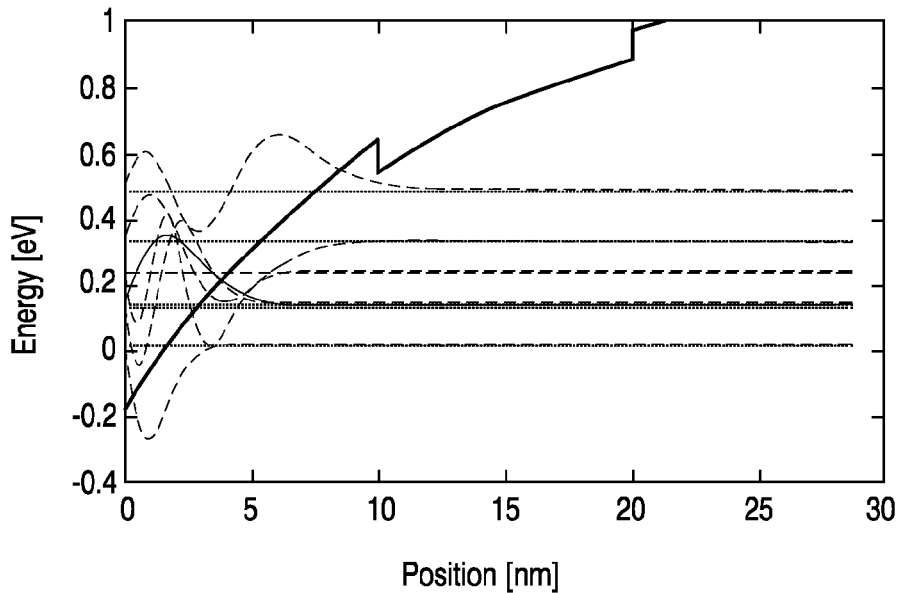
FIG. 3 shows the conduction band as a function of depth in the embodiment of FIG. 2.

In FIG. 3, the conduction band is shown as a function of depth below first major surface 24 below the gate insulator layer 26 with a voltage of +1V on the gate, which would be expected to draw the n-type conduction region from the drain under the gate. The accumulation layer is present between 10 nm and 20 nm depth. As will be seen, the SiGe layer is poor at confining electrons.

Figure 4:
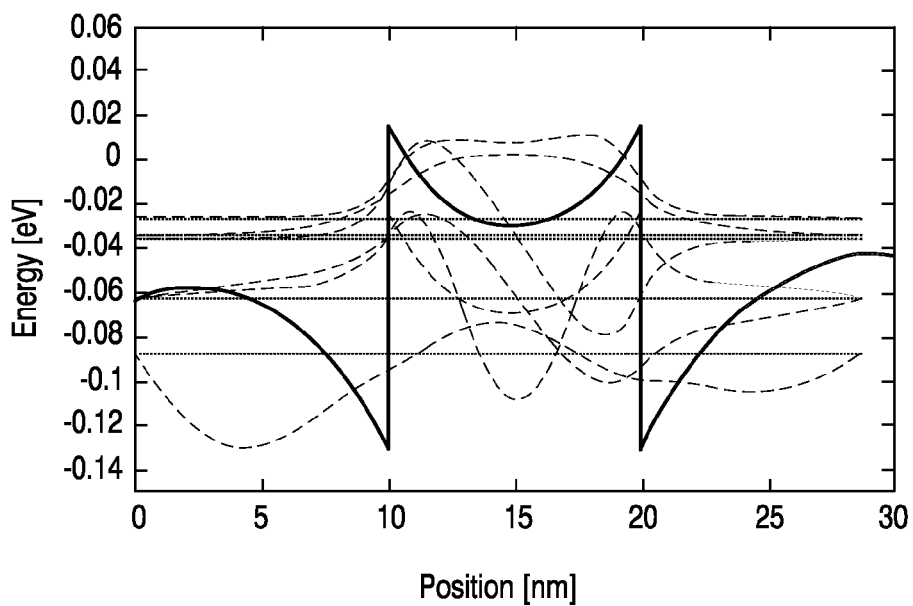
FIG. 4 shows the valence band as a function of depth in the embodiment of FIG. 2.

FIG. 4 shows the corresponding valence band as a function of depth below the first major surface for a gate voltage of −1V, and it will be seen that in this case good confinement of holes is provided in the accumulation layer.

Figure 5:
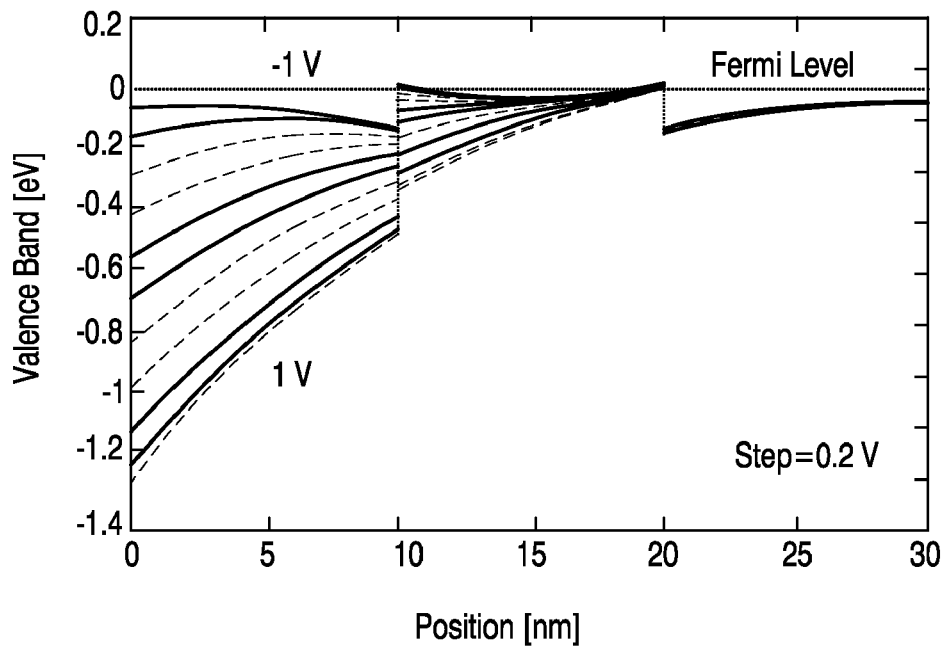
FIG. 5 shows the valence band diagram for various gate voltages.
Figure 6:
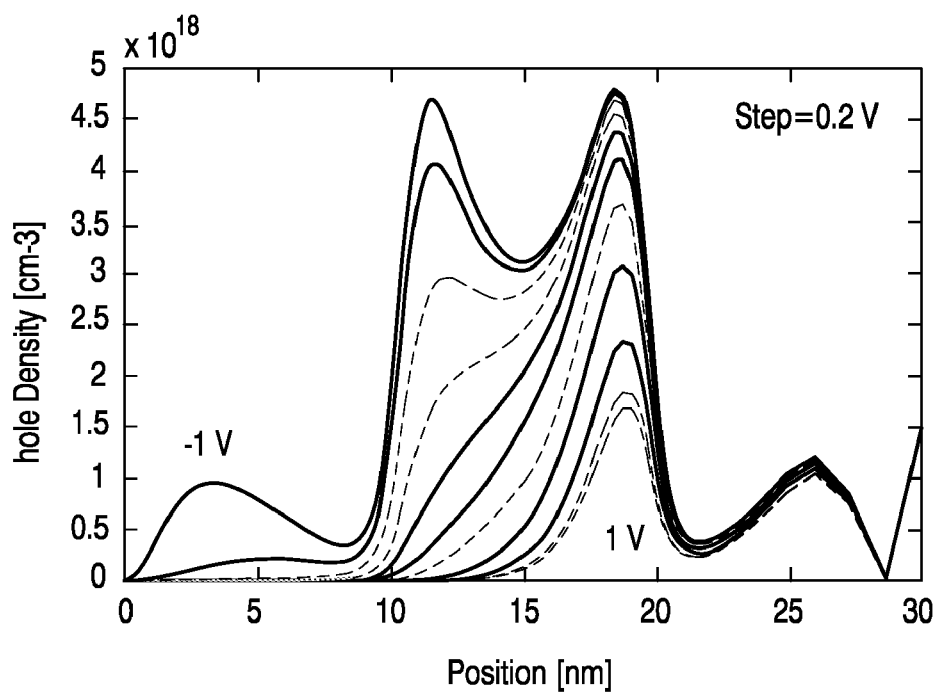
FIG. 6 shows the hole density for various gate voltages.

FIGS. 5 and 6 illustrate the effect of changing gate voltage. The valence band diagram is shown in FIG. 5 for various gate voltages from −1V to +1V (note that this is at a different scale to FIG. 4). FIG. 6 shows the hole concentration for the same gate voltages as a function of depth.

It will be noted from FIG. 6 that there are two peaks in hole concentration, one near the boundary between the cap layer and the accumulation layer at 10 nm and one near the boundary between the accumulation layer and lower layer at 20 nm. The gate is very efficient at modulating the hole concentration in the upper of these two peaks at 10 nm, but much less efficient at controlling the hole concentration in the lower of these two peaks at 20 nm. This lower hole layer thus has the potential to form a parasitic channel.

It is for this reason that the depth of the source and drain regions are limited. In a preferred embodiment, the p-n junction below the drain region is arranged to be in the centre of the accumulation layer, i.e. half way between the boundary between the cap layer and the accumulation layer and the boundary between the accumulation layer and lower layer. This is the reason that in the embodiment described, the source and drain diffusions 4,6 have a depth of approximately 15 nm, i.e. the junction p-n junction where present is at this depth, half way between the two boundaries at 10 nm and 20 nm.

In this way, even if the hole concentration in the parasitic channel is high, it is disconnected from the source and drain regions 4, 6 and hence does not contribute to the total current of the device.

In use, a negative voltage may be applied to the gate which results in the p-type conductivity region extending from the source towards the drain, where there is an n-type conductivity region. This is done since, in this embodiment, as described above, the valence band is able to confine holes but the conduction band is not able to effectively confine electrons. A p-n junction is formed between source and drain near the drain, roughly at the location indicated by arrow 26 in FIG. 2. A depletion layer is formed between the p-type and n-type conductivity region.

Changing the gate voltage changes the thickness of the depletion layer and this in turn greatly affects the tunneling current. Thus, the device is very sensitive to gate voltage.

Figure 7:
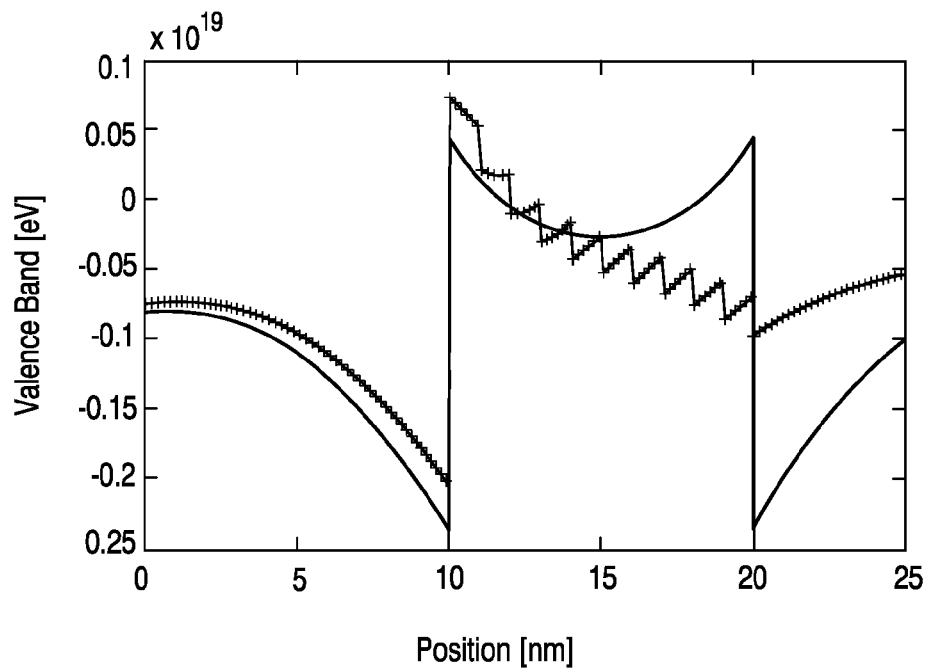
FIG. 7 shows the valence band diagram for a second embodiment of the invention.
Figure 8:
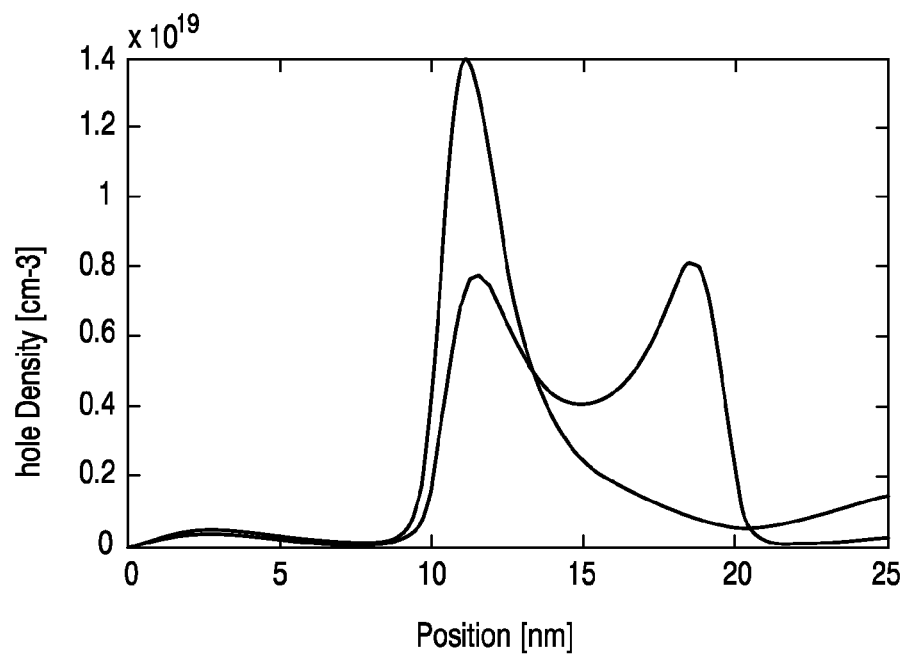
FIG. 8 shows the hole density as a function of depth for the first and second embodiments.

An alternative embodiment is illustrated in FIGS. 7 and 8. The basic form of the device is as illustrated in FIG. 2, but in this case the fraction of Ge in the $Si_{1-x}Ge_x$ accumulation layer 20 is graded substantially linearly from x=0 at the interface between the accumulation layer 20 and the lower layer 2 to a maximum value $x_{max}$=0.4 at the interface between the cap layer 22 and the accumulation layer 20.

FIG. 7 shows the valance band in this graded case as well as in the embodiment of FIG. 2 for comparison. FIG. 8 shows the hole density again as a function of depth. In both Figures the gate voltage is −1V.

It will be observed from these Figures that there is essentially no confinement at 20 nm depth, i.e. the parasitic channel is essentially eliminated. The bulk of the holes are at a depth of around 10 nm.

Thus, the depth of the source and drain diffusions is less important in this second embodiment, as long as the diffusion depth is sufficient to reach the interface between cap layer 22 and accumulation layer 20.

Those skilled in the art will readily appreciate that modifications may be made to the embodiments described.

The exact depths of the layers may be varied.

In particular, the thickness of the cap layer may be varied. The presence of a cap layer of silicon is very useful since it greatly improves the interface quality with the gate oxide layer. However, it is beneficial to reduce the thickness of the cap layer as much as possible for two reasons. Firstly, reducing the distance between the gate and the accumulation layer increases the efficiency of modulating the depletion region. Secondly, a parasitic accumulation layer may be formed in the cap layer, which shields the accumulation layer and so reduces the control exerted by the gate electrode.

For these reasons, although the example has a cap layer of thickness 10 nm, any suitable thickness may be used, with preferred values being between 3 nm and 15 nm, preferably 10 nm or less, further preferably 5 nm or less.

As for the SiGe accumulation layer 20, the mole fraction of $x_{max}$ of 0.4 is not required and other suitable values are possible, for example from $x_{max}$=0.2 to 0.5, preferably $x_{max}$=0.35 to 0.45.

Other materials for the semiconductor layers, i.e. the accumulation layer, cap layer and lower layer may be used to form the quantum well of the accumulation layer.

The thickness of the accumulation layer 20 may also be varied. It is beneficial not to generate excess stress in the device and those skilled in the art will realise that the thickness of the accumulation layer of different material will be based on the exact material used, in the case of SiGe the mole fraction. The thickness of 10 nm gives rise to good stability for x up to 0.4, but thicknesses in the range 5 nm to 20 nm are possible.

Additional layers or contacts may also be added as is known. For example, one or more epilayers may be introduced on substrate 2, or the device may be formed in layers formed on an insulator.

The device has a p type source and n-type drain, but these may be changed, especially with different material choices for the semiconductor layers.

The invention claimed is:

1. A semiconductor device, comprising:
   a source diffusion of a first conductivity type at a first major surface of the semiconductor device;
   a drain diffusion a second conductivity type opposite to the first conductivity type laterally spaced from the source diffusion at the first major surface;
   a lower doped region between the source diffusion and the drain diffusion at the first major surface, the lower doped region having a lower dopant concentration than the source diffusion and the drain diffusion;
   an insulated gate on the first major surface over the lower doped region;
   wherein the semiconductor device includes a cap layer of a first semiconductor material at the first major surface, an accumulation layer formed under the cap layer of a second semiconductor material different to the first semiconductor material, and a lower layer under the accumulation layer of a different material to the second semiconductor material to form a quantum well for confining electrons, holes, or both in the accumulation layer.

2. The semiconductor device according to claim 1, wherein the cap layer and lower layer are of silicon and the accumulation layer is of silicon germanium.

3. The semiconductor device according to claim 2 wherein the accumulation layer is graded having a formula $Si_{1-x}Ge_x$ with the value x varying with depth below the first major surface.

4. The semiconductor device according to claim 3 wherein x varies from 0 at the interface between the accumulation layer and the lower layer to a maximum value at the interface between the accumulation layer and the cap layer.

5. The semiconductor device according to claim 4 wherein the maximum value of x is in the range 0.2 to 0.5.

6. The semiconductor device according to claim 1, wherein the drain diffusion extends from the first major surface through an interface between the cap layer and the accumulation layer but is spaced from the interface between the accumulation layer and the lower layer.

7. The semiconductor device according to claim 1, wherein a thickness of the accumulation layer is in the range 5 nm to 20 nm.

8. The semiconductor device according to claim 1, wherein a thickness of the cap layer is in the range 3 nm to 15 nm.

9. The semiconductor device according to claim 1, wherein the first conductivity type is n type and the second conductivity type is p type.

10. A method of operation of a semiconductor device including a source diffusion of a first conductivity type at a first major surface of the semiconductor device, a drain diffusion of a second conductivity type opposite to the first conductivity type laterally spaced from the source diffusion at the first major surface, a lower doped region between the source diffusion and the drain diffusion at the first major surface, the lower doped region having a lower dopant concentration than the source diffusion and the drain diffusion, an insulated gate on the first major surface over the lower doped region, wherein the semiconductor device includes a cap layer of a first semiconductor material at the first major surface, an accumulation layer formed under the cap layer of a second semiconductor material different to the first semiconductor material, and a lower layer under the accumulation layer of a different material to the second semiconductor material to form a quantum well for confining electrons, holes, or both in the accumulation layer, the method comprising:
   applying a voltage between the source diffusion and drain diffusion; and
   applying a voltage to the gate electrode to modulate the width of a depletion region in the lower doped region between a region of first conductivity type at the source region and a region of second conductivity type at the drain region.

* * * * *